(12) United States Patent
Hou et al.

(10) Patent No.: US 12,073,807 B2
(45) Date of Patent: Aug. 27, 2024

(54) DISPLAY APPARATUS AND METHOD FOR DRIVING DISPLAY APPARATUS

(71) Applicants: Beijing BOE Display Technology Co., Ltd., Beijing (CN); BOE Technology Group Co., Ltd., Beijing (CN)

(72) Inventors: Wenjie Hou, Beijing (CN); Cong Wang, Beijing (CN); Yingmeng Miao, Beijing (CN); Dongchuan Chen, Beijing (CN); Jiantao Liu, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/016,845

(22) PCT Filed: Feb. 18, 2022

(86) PCT No.: PCT/CN2022/076920
§ 371 (c)(1),
(2) Date: Jan. 18, 2023

(87) PCT Pub. No.: WO2023/155164
PCT Pub. Date: Aug. 24, 2023

(65) Prior Publication Data
US 2024/0249695 A1   Jul. 25, 2024

(51) Int. Cl.
*G09G 3/36* (2006.01)
*H05K 1/18* (2006.01)

(52) U.S. Cl.
CPC ......... *G09G 3/3677* (2013.01); *G09G 3/3688* (2013.01); *H05K 1/189* (2013.01);
(Continued)

(58) Field of Classification Search
CPC .............. G09G 3/3677; G09G 3/3688; G09G 2320/041; H05K 1/189; H05K 2201/10136
See application file for complete search history.

(56) References Cited

U.S. PATENT DOCUMENTS

2006/0119560 A1   6/2006   Jeon
2011/0285679 A1   11/2011  Oh et al.
(Continued)

FOREIGN PATENT DOCUMENTS

CN   1783702 A    6/2006
CN   102254523 A  11/2011
(Continued)

*Primary Examiner* — Brent D Castiaux
(74) *Attorney, Agent, or Firm* — IPro, PLLC

(57) ABSTRACT

Provided are a display apparatus and a method for driving display apparatus. The display apparatus includes a display substrate; the display substrate includes: gate drive circuit, connected with gate lines disposed in the display area; a plurality of clock signal lines; and a bonding pad; a first circuit board; and a second circuit board; the first circuit board and the second circuit board are independent of each other; the first circuit board is disposed at a side, facing away from the display area, of the second circuit board; the first circuit board and the second circuit board are electrically connected with the bonding pad; the first circuit board is electrically connected with the gate drive circuit via the plurality of clock signal lines; and in an extension direction of the gate line, a width of the first circuit board is smaller than a width of the second circuit board.

20 Claims, 5 Drawing Sheets

(52) U.S. Cl.
CPC .............. *G09G 2320/041* (2013.01); *H05K 2201/10136* (2013.01)

(56) References Cited

U.S. PATENT DOCUMENTS

| | | |
|---|---|---|
| 2015/0379951 A1 | 12/2015 | Zeng |
| 2016/0190228 A1* | 6/2016 | Park .................. H10K 59/1315 |
| | | 257/40 |
| 2017/0135213 A1 | 5/2017 | Lee et al. |
| 2017/0337887 A1 | 11/2017 | Yonebayashi et al. |
| 2018/0130828 A1 | 5/2018 | Lee et al. |
| 2019/0013332 A1 | 1/2019 | Lee |
| 2019/0197976 A1* | 6/2019 | Sasaki .................. G09G 3/3648 |
| 2020/0142268 A1 | 5/2020 | Shin et al. |
| 2020/0301193 A1* | 9/2020 | Lee .................. G02F 1/133308 |

FOREIGN PATENT DOCUMENTS

| | | |
|---|---|---|
| CN | 103745707 B | 11/2015 |
| CN | 107077821 A | 8/2017 |
| CN | 107293568 A | 10/2017 |
| CN | 107340657 A | 11/2017 |
| CN | 109935217 A | 6/2019 |
| CN | 107516500 B | 12/2019 |
| CN | 111142295 A | 5/2020 |
| CN | 109496067 B | 9/2020 |
| CN | 106896597 B | 4/2021 |
| JP | 2010249889 A | 11/2010 |
| JP | 2011250107 A | 12/2011 |

\* cited by examiner

| | |
|---|---|
| Providing, by the first circuit board, clock signals for a gate drive circuit by means of a plurality of clock signal lines | S101 |
| Providing, by the second circuit board, data drive signals for a display substrate by means of a plurality of data lines of the display substrate | S102 |

DISPLAY APPARATUS AND METHOD FOR DRIVING DISPLAY APPARATUS

CROSS REFERENCE TO RELATED APPLICATIONS

The present disclosure is a National Stage of International Application No. PCT/CN2022/076920, filed Feb. 18, 2022.

FIELD

The present disclosure relates to the technical field of display, in particular to a display apparatus and a method for driving the display apparatus.

BACKGROUND

Rapid development of display technology spurs development of a display panel toward high integration and low cost. The gate driver on array (GOA) technology integrates a thin film transistor (TFT) gate drive circuit on an array substrate of the display panel to form a scanning drive for the display panel, such that wiring space for a bonding region and a fanout region of the gate integrated circuit (IC) can be omitted, the product cost can be reduced in terms of material cost and manufacturing process, and the display panel can be designed attractive with symmetrical sides and narrow bezels.

As the product size continuously increases, the refresh frequency and the resolution keep increasing, a large number of clock signal lines (CLK) are connected with the gate drive circuit, and are located at corners of a chip on film (COF) and a panel under limited wiring space for a patterned line on glass (PLG) between the COF and GOA, which makes it extremely easy to accumulate heat due to bending and causes overall heating of the PLG. However, overheating of the PLG will affect the high temperature and high humidity reliability in the entire GOA region, and even burn down a polarizer (POL). Besides, heat will be transferred to a display area (AA), which makes liquid crystal in the AA clear and lose liquid crystal features due to the high temperature.

Thus, how to lower the temperature of the PLG has become an urgent technical problem.

SUMMARY

The present disclosure provides a display apparatus and a method for driving the display apparatus for lowering temperature of a patterned line on glass (PLG).

In a first aspect, an embodiment of the present disclosure provides a display apparatus.

The display apparatus includes:
a display substrate, including a display area and a non-display area; where the display substrate includes: gate drive circuit, connected with gate lines disposed in the display area; a plurality of clock signal lines; and a bonding pad;
a first circuit board; and
a second circuit board;
where the first circuit board and the second circuit board are independent of each other; the first circuit board is disposed at a side, pointing from the display area to the non-display area, of the second circuit board; the first circuit board and the second circuit board are electrically connected with the bonding pad; the first circuit board is electrically connected with the gate drive circuit by means of the plurality of clock signal lines; and in an extension direction of the gate line, a width of the first circuit board is smaller than a width of the second circuit board.

In some embodiments, gate drive circuits are respectively arranged on two different areas of the non-display area, and the two different areas correspond to the two opposite sides of the display area; and
the display apparatus includes two first circuit boards, and the two first circuit boards are respectively connected with the two gate drive circuits in the non-display area.

In some embodiments, the first circuit board and the second circuit board are flexible printed circuits, and the display apparatus further includes a printed circuit board, an end of the first circuit board is electrically connected with the bonding pad, and the other end of the first circuit board is electrically connected with the printed circuit board.

In some embodiments, in the first circuit board and the second circuit board, merely the second circuit board includes a data drive chip.

In some embodiments, the display substrate includes a plurality of data lines, and the data drive chip is electrically connected with the plurality of data lines.

In some embodiments, a width of the first circuit board ranges from 3.0 mm to 4.0 mm in the extension direction of the gate line.

In some embodiments, the clock signal lines have equal lengths in a transmission direction of a clock signal on the clock signal lines.

In some embodiments, the clock signal lines have equal widths, ranging from 120 μm to 150 μm, in the extension direction of the gate line.

In some embodiments, a distance between two adjacent clock signal lines ranged from 15 μm to 20 μm.

In some embodiments, each of the clock signal lines includes a first portion, a second portion and a third portion connected in sequence, where the first portion is electrically connected with the gate drive circuit; the third portion is electrically connected with the bonding pad; an extension direction of the first portion and an extension direction of the third portion are same as an extension direction of the bonding pad; the first portion is separated from the third part by a preset distance in a direction facing away from the bonding pad, and an extension direction of the second portion intersects with the extension direction of the bonding pad.

In some embodiments, each of the clock signal lines is configured to provide a clock signal for the gate drive circuit; a rising edge of the clock signal from a low level to a high level is stepped; and the rising edge comprises at least an intermediate potential arranged between the low level and the high level.

In some embodiments, a resistor is arranged between each of the clock signal lines and the first circuit board.

In some embodiments, the resistor is arranged on the first circuit board; or, the resistor is arranged on the display substrate.

In a second aspect, an embodiment of the present disclosure further provides a method for driving the display apparatus described by any item above. The drive method includes:
providing, by the first circuit board, clock signals for a gate drive circuit by means of a plurality of clock signal lines; and
providing, by the second circuit board, data drive signals for a display substrate by means of a plurality of data lines of the display substrate.

In some embodiments, the method further includes:
controlling, during a rising edge of the clock signals switching from a low level to a high level, the clock signals to switch from the low level to an intermediate potential, keep at the intermediate potential for preset duration, and switch from the intermediate potential to the high level.

In some embodiments, the preset duration is equal to scanning duration for scanning each row of pixels of the display substrate by the gate drive circuit.

In some embodiments, a value of the intermediate potential is equal to an average of total values of the low level and the high level.

DETAILED DESCRIPTION OF THE EMBODIMENTS

Figure 1:
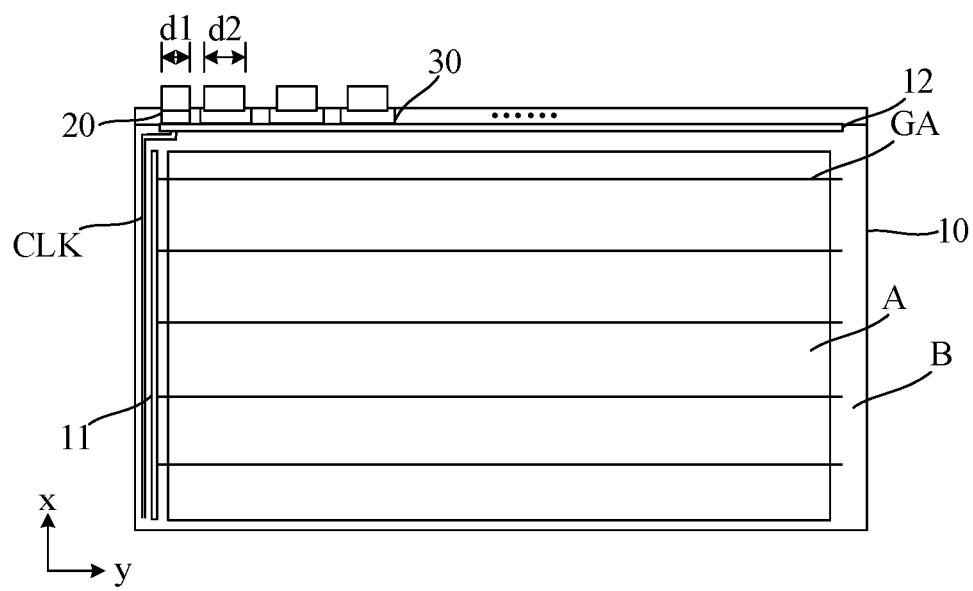
FIG. 1 is a schematic structural diagram of a display apparatus according to an embodiment of the present disclosure.

In order to make objectives, technical solutions and advantages of embodiments of the present disclosure clearer, the technical solutions of the embodiments of the present disclosure will be clearly and completely described with reference to accompanying drawings of the embodiments of the present disclosure. Apparently, the described embodiments are merely some rather than all of the embodiments of the present disclosure. In addition, the embodiments in the present disclosure and features in the embodiments can be combined mutually if there is no conflict. All other embodiments derived by a person of ordinary skill in the art based on the described embodiments of the present disclosure without creative efforts shall fall within the protection scope of the present disclosure.

Unless otherwise defined, technical terms or scientific terms used in the present disclosure should have ordinary meanings understood by those of ordinary skills in the field to which the present disclosure belongs. Words such as "include" or "encompass" used in the present disclosure are intended to mean that an element or item in front of the word encompasses elements or items that are present behind the word and equivalents thereof, but does not exclude other elements or items.

It should be noted that a size and a shape of each figure in the accompanying drawings do not reflect true scales, and are merely intended to illustrate contents of the present disclosure. Throughout the accompanying drawings, identical or similar reference numerals denote identical or similar elements or elements having identical or similar functions.

In related technologies, a large number of clock signal lines (CLK) are located at corners of COF and a panel under limited wiring space for a patterned line on glass (PLG) between chip on film (COF) and GA driver on array (GOA), which makes it extremely easy to accumulate heat due to bending, and causes overall heating of the PLG. Overheating of the PLG will affect the high temperature and high humidity reliability in the whole GOA region, and even burn down a polarizer (POL), and in addition, heat can be transferred to a display area (AA), which makes liquid crystal in the AA clear and lose liquid crystal features due to the high temperature.

In view of this, the embodiments of the present disclosure provide a display apparatus and a method for driving the display apparatus for lowering temperature of the PLG.

As shown in FIG. 1, the display apparatus is shown according to the embodiment of the present disclosure. The display apparatus includes:
a display substrate 10 including a display area A and a non-display area B, where the display substrate 10 includes gate drive circuit 11, a plurality of clock signal lines CLK and a bonding pad 12, and the gate drive circuit 11 is electrically connected with a gate line GA of the display area A; and
a first circuit board 20 and a second circuit board 30 that are independent of each other, where the first circuit board 20 is disposed at a side, pointing from the display area A to the non-display area B, of the second circuit board 30, the first circuit board 20 and the second circuit board 30 are electrically connected with the bonding pad 12, the first circuit board 20 is electrically connected with the gate drive circuit 11 by means of the plurality of clock signal lines CLK, and in an extension direction of the gate line GA, a width of the first circuit board 20 is smaller than a width of the second circuit board 30.

In some embodiments, the display substrate 10 in the display apparatus includes the display area A and the non-display area B. The display area A and the non-display area B may be divided as shown in FIG. 1, or the display area A and the non-display area B may be divided according to actual application needs, which is not limited herein. The display substrate 10 includes the gate drive circuit 11, the plurality of clock signal lines CLK, and the bonding pad 12, and the gate drive circuit 11 is electrically connected with the gate line of the display area A. The number of the clock signal lines CLK and the number of the gate lines GA may be arranged according to actual application needs, which is not limited herein. In FIG. 1, four clock signal lines CLK are taken as an embodiment. The gate drive circuit 11 includes a plurality of shift registers arranged in an extension direction of the clock signal line CLK, and the number of shift registers may be arranged according to the actual application needs, which is not limited herein. A structure of each shift register in the gate drive circuit 11 may be arranged with reference to a structure in the related technologies, and will not be described in detail herein.

In some embodiments, the display apparatus further includes the first circuit board 20 and the second circuit board 30 that are independent of each other, where the first circuit board 20 is located at the side, pointing from the display area A to the non-display area B, of the second circuit board 30, and the first circuit board 20 and the second circuit board 30 are electrically connected with the bonding pad 12. In this way, a relevant drive signal may be transmitted to the display substrate 10 by means of the first circuit board 20 and the second circuit board 30, thereby controlling the display substrate 10. In addition, the first circuit board 20 is electrically connected with the gate drive circuit 11 by means of the plurality of clock signal lines CLK. In this way, the first circuit board 20 may provide the required clock signal for the gate drive circuit 11 by means of the plurality of clock signal lines CLK, thereby guaranteeing a drive function of the gate drive circuit 11.

In addition, the width, in the extension direction of the GA, of the first circuit board 20 is smaller than the width of the second circuit board 30. With reference to FIG. 1, the extension direction of the gate line GA may be a direction shown by arrow Y in FIG. 1, and a direction shown by arrow X may be a direction along the clock signal line CLK. With reference to FIG. 1, d1 represents the width, in the extension direction of the gate line GA, of the first circuit board 20, and d2 represents the width, in the extension direction of the gate line GA, of the second circuit board 30, d1<d2. Since the width, in the extension direction of the gate line GA, of the first circuit board 20 is smaller than the width of the second circuit board 30, when widths of pins arranged on the first circuit board and the second circuit board and a distance between two adjacent pins are equal, the number of pins that may be arranged on the first circuit board 20 is smaller than the number of pins that may be arranged on the second circuit board 30. In this way, the pins arranged on the first circuit board 20 are merely electrically connected with the bonding pad connected with the clock signal lines. In addition, since the first circuit board 20 is located on the side, pointing from the display area A to the non-display area B, of the second circuit board 30, the first circuit board 20 is closer to the gate drive circuit 11 than the second circuit board 30, such that it is easier to lay out the plurality of clock signal lines CLK. The plurality of clock signal lines CLK electrically connected with the first circuit board 20 and the gate drive circuit 11 may be arranged shorter in length. Under the condition that the plurality of clock signal lines CLK are widened, a line resistance of each clock signal line CLK may be effectively reduced, such that temperature on the clock signal line CLK is lowered, that is, temperature of the PLG is lowered, influence on the high-temperature and high-humidity reliability of the GOA region is avoided, the POL is prevent from being burned, the heat is prevented from being transferred to the AA, and usability of the display apparatus is guaranteed.

Figure 2:
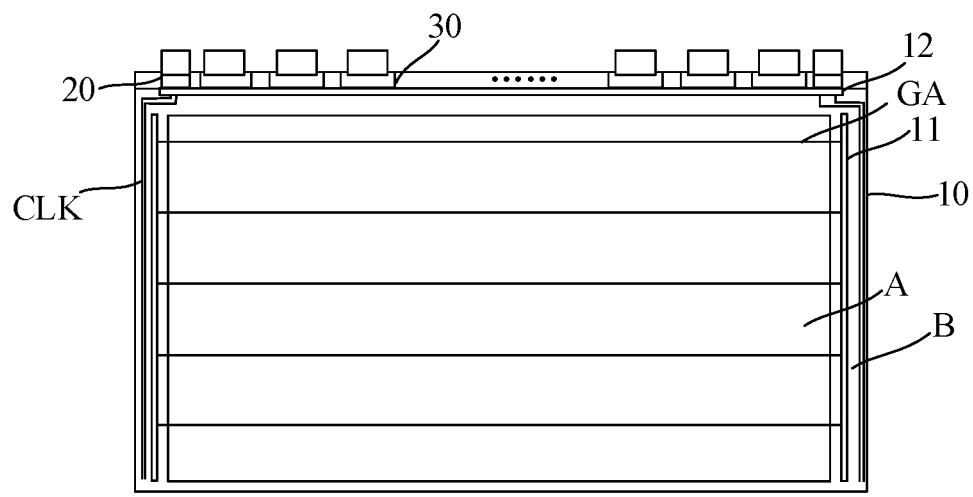
FIG. 2 is a schematic structural diagram of a display apparatus according to an embodiment of the present disclosure.

In an embodiment of the present disclosure, as shown in FIG. 2, a schematic structural diagram of a display apparatus is shown, the display apparatus includes two gate drive circuits 11, the two gate drive circuits 11 are respectively arranged on two different areas of the non-display area B, and the two different areas correspond to the two opposite sides of the display area A; and the display apparatus includes two first circuit boards 20, and the two first circuit boards 20 are respectively connected with the two gate drive circuits 11 in the non-display area B.

In some embodiments, the gate drive circuit 11 are located on two sides, opposite the display area A, of the non-display area B, that is the two gate drive circuit 11 are provided, the display substrate 10 may be driven bilaterally by means of the gate drive circuit 11, thereby guaranteeing usability of the display apparatus. The first circuit board 20, the second circuit board 30 and the bonding pad 12 are arranged on the other side of the display area A, thus guaranteeing narrow bezel design of the display apparatus. The two first circuit boards 20 are provided, and the first circuit boards 20 correspond to the gate drive circuit of the non-display area B respectively, that is to say, the first circuit boards 20 are arranged at outermost sides of two sides of the second circuit board 30. In this way, the two first circuit boards 20 having a width smaller than that of the second circuit board 30 are arranged at the outermost sides of the two sides of the second circuit board 30, thereby guaranteeing that the plurality of clock signal lines CLK may be arranged wider and shorter at the outermost sides of the two sides of the second circuit board 30, further lowering the temperature of the clock signal lines CLK, lowering the temperature of PLG, and guaranteeing the usability of the display apparatus.

Figure 3:
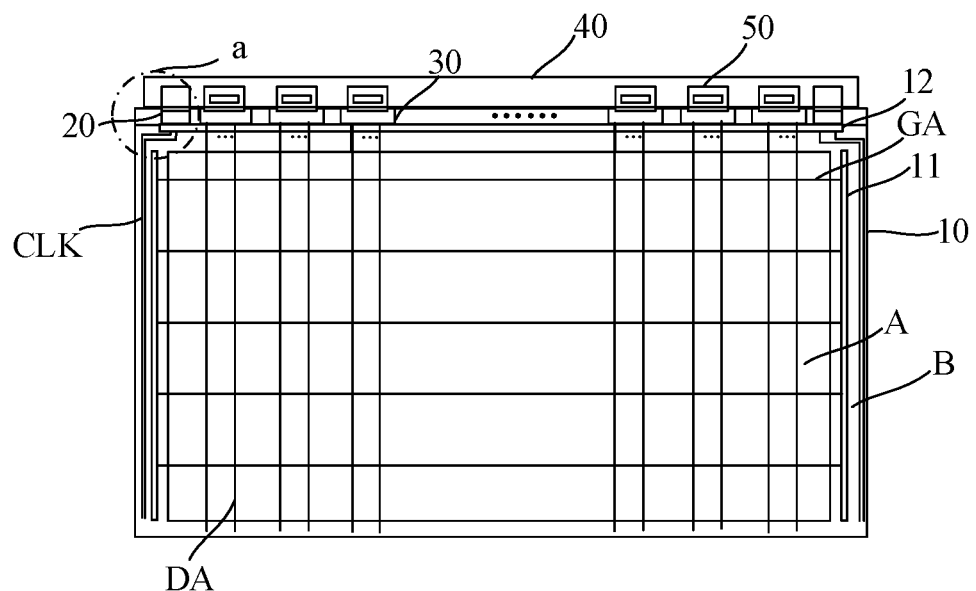
FIG. 3 is a schematic structural diagram of a display apparatus according to an embodiment of the present disclosure.

In an embodiment of the present disclosure, as shown in FIG. 3, a schematic structural diagram of a display apparatus is shown, the first circuit board 20 and the second circuit board 30 are flexible printed circuits, and the display apparatus further includes: a printed circuit board 40, an end of the first circuit board 20 is electrically connected with the bonding pad 12, and the other end of the first circuit board 20 is electrically connected with the printed circuit board 40.

In some embodiments, the first circuit board 20 and the second circuit board 30 are flexible printed circuits (FPC), and the display apparatus further includes a printed circuit board (PCB) 40, an end of the first circuit board 20 is electrically connected with the bonding pad 12, and the other end of the first circuit board 20 is electrically connected with the printed circuit board 40. In this way, a drive signal provided by the printed circuit board 40 may be provided for the display substrate 10 by means of the first circuit board 20, thereby guaranteeing the usability of the display apparatus. In addition, an end of the second circuit board 30 may be electrically connected with the bonding pad 12, and the other end of the second circuit board 30 may be electrically connected with the printed circuit board 40. In this way, a drive signal provided by the printed circuit board 40 may be provided for the display substrate 10 by means of the second circuit board 30, thereby guaranteeing the usability of the display apparatus.

In an embodiment of the present disclosure, with reference to FIG. 3, in the first circuit board 20 and the second circuit board 30, merely the second circuit board 30 includes a data drive chip 50. That is, merely the second circuit board 30 is provided with the data drive chip 50, but the first circuit board 20 is not provided with the data drive chip 50. In this way, the data drive chip 50 may provide a required data drive chip 50 for the display substrate 10 by means of the second circuit board 30, thereby guaranteeing usability of the display substrate 10.

In an embodiment of the present disclosure, with reference to FIG. 3, the display substrate 10 includes a plurality of data lines DA, and the data drive chip 50 is electrically connected with the plurality of data lines DA. In this way, the data drive chip 50 may provide the required data drive signals for the display substrate 10 by means of the second circuit board 30 and the plurality of data lines DA, and the specific number of the plurality of data lines DA may be arranged according to the actual application requirements, which is not limited herein.

In an embodiment of the present disclosure, a width of the first circuit board 20 ranges from 3.0 mm to 4.0 mm in the extension direction of the gate line GA.

In some embodiments, the first circuit board 20 has the width ranging from 3.0 mm to 4.0 mm in the extension direction of the gate line GA. For embodiment, the first circuit board 20 may have the width of 3.5 mm. In this way, a shorter clock signal line CLK may be laid out between the first circuit board 20 closer to the gate drive circuit 11 and the gate drive circuit 11, such that while layout efficiency is improved, each clock signal line CLK may be further widened, the temperature of the PLG is lowered, and the usability of the display apparatus is guaranteed.

Figure 4:
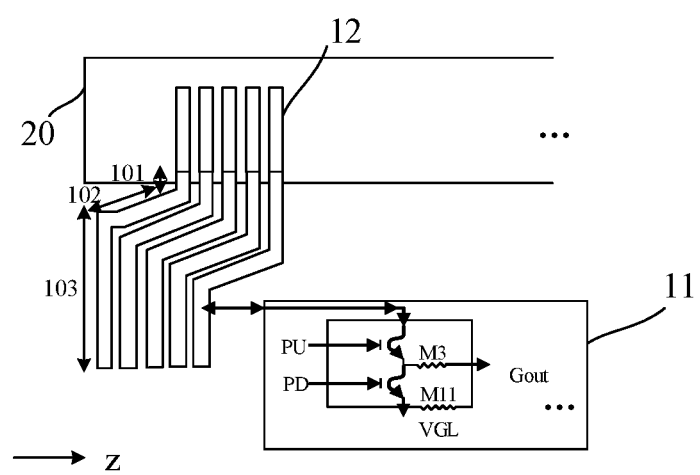
FIG. 4 is a schematic enlarged structural diagram of region a in FIG. 3.

As shown in FIG. 4, a schematic enlarged structural diagram of area A in FIG. 3 is shown. The clock signal lines have equal lengths in a transmission direction of a clock signal on the clock signal lines. Since the clock signal lines have equal lengths in the transmission direction of the clock signal on the clock signal lines, it is guaranteed that the clock signal lines CLK have the same resistance, are consistent in load, and uniform in temperature, such that undifferentiated voltages may be provided for the gate drive circuit 11, and the usability of the display apparatus is guaranteed.

In an embodiment of the present disclosure, the clock signal lines CLK have equal widths, ranging from 120 μm to 150 μm, in the extension direction of the gate line GA. In the embodiment of the present disclosure, the clock signal lines CLK may have a width, for embodiment, 136 μm with an increase of 20 μm-50 μm, in the extension direction of the gate line GA. It is certain that a specific width of the clock signal line CLK in the transmission direction of the clock signal on the clock signal line CLK may be arranged according to the actual application needs, which is not limited herein.

In an embodiment of the present disclosure, a distance between two adjacent clock signal lines ranges from 15 μm to 20 μm. With reference to FIG. 4, d represents the distance between two adjacent clock signal lines CLK. In some embodiments, the plurality of clock signal lines CLK are arranged at equal intervals, for embodiment, the distance between two adjacent clock signal lines CLK is 18 μm. It is certain that an appropriate distance may be selected from 15 μm to 20 μm according to the actual application needs, which is not limited herein.

In an embodiment of the present disclosure, with reference to FIG. 4, each clock signal line includes a first portion 101, a second portion 102 and a third portion 103 that are connected in sequence, where the first portion 101 is electrically connected with the gate drive circuit 11, the third portion 103 is electrically connected with the bonding pad 12, an extension direction of the first portion 101 and an extension direction of the third portion 103 are same as an extension direction of the bonding pad 12, the first portion 101 is separated from the third part 103 by a preset distance in a direction facing away from the bonding pad 12, and an extension direction of the second portion 102 intersects with the extension direction of the bonding pad 12.

In some embodiments, each clock signal line includes the first portion 101, the second portion 102 and the third portion 103 that are connected in sequence. The first portion 101 is electrically connected with the gate drive circuit 11, the third portion 103 is electrically connected with the bonding pad 12, the first portion 101 and the third portion 103 are arranged in an extension direction of the bonding pad 12, the first portion 101 is translated by the preset distance with respect to the third portion 103 in the direction facing away from the bonding pad 12, and the preset distance may be arranged according to the actual application needs, which is not limited herein. In addition, the second portion 102 intersects with the extension direction of the bonding pad 12, and a direction indicated by arrow Z in FIG. 4 is the direction intersecting with the extension direction of the bonding pad 12. In addition, a partial structure of the gate drive circuit 11 is illustrated in FIG. 4, but the structure of the gate drive circuit is not limited thereto, and may be specifically arranged with reference to related technologies, which is not described in detail herein.

Figure 5:
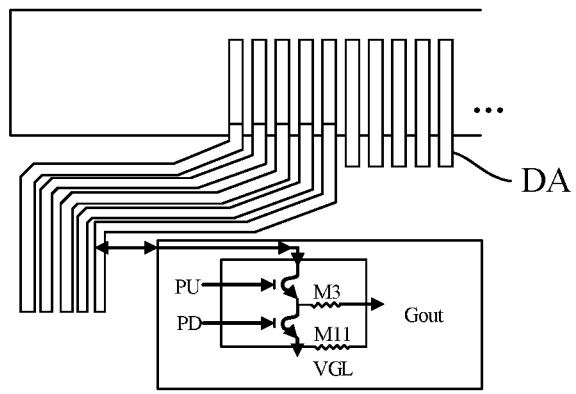
FIG. 5 is a schematic structural diagram of patterned line on glass (PLG) wiring in related technology.

In some embodiments, as shown in FIG. 5, a schematic structural diagram of a PLG in related technologies is shown, each clock signal line CLK includes four portions connected in sequence, each clock signal line CLK is longer than the clock signal line CLK in FIG. 4, and each clock signal line CLK is narrower than the clock signal line CLK in FIG. 4. In this way, each clock signal line CLK in FIG. 4 has a small line resistance, such that the temperature on each clock signal line CLK may be lowered in practical application, and the usability of the display apparatus is guaranteed. In addition, when the first circuit board 20 is close enough to the gate drive circuit 11, the PLG may be changed from a bent connection to a direct connection, thereby avoiding corner formation by the PLG. In an exemplary embodiment, the PLG may be directly introduced into the COF Pin region from the GOA region, and may be bonded to the FPC with a gold finger, so as to be directly connected with a printed circuit board (XPCB), thereby achieving direct connection of the PLG. In this direct connection manner, the PLG may be made wider and shorter, such that the line resistance of the PLG is reduced, the temperature of the PLG is lowered, the temperature of the PLG is kept at a low level, and high temperature and high humidity reliability of the display apparatus is improved.

Figure 6:
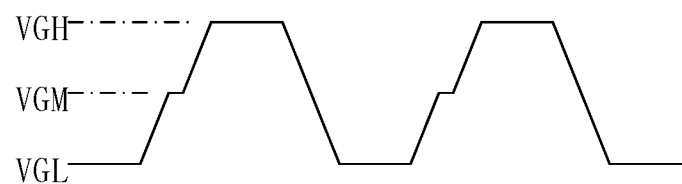
FIG. 6 is a schematic signal diagram of a clock signal provided for a gate drive circuit by a clock signal line in a display apparatus according to an embodiment of the present disclosure.

In an embodiment of the present disclosure, each clock signal line CLK is configured to provide the clock signal for the gate drive circuit 11, a rising edge of the clock signal from a low level to a high level is stepped, and the rising edge includes at least an intermediate potential, the intermediate potential being arranged between the low level and the high level. FIG. 6 is a schematic signal diagram of a clock signal provided for a gate drive circuit 11 by a clock signal line CLK. In some embodiments, the rising edge of the clock signal from the low level to the high level is stepped, and the rising edge includes at least an intermediate potential, one or more intermediate potentials may be arranged, and may be arranged according to the actual application needs. With reference to FIG. 6, an intermediate potential VGM is added during rising of the clock signal. In this way, a voltage difference of the clock signal is set to VGH−VGM or VGM−VGL during clock signal level pulling, the voltage difference is greatly reduced, such that a root-mean-square current of the clock signal line CLK may be significantly reduced, and the temperature of the PLG may be lowered.

It should be noted that a shift register in the gate drive circuit 11 may be a circuit structure including an M3 transistor and an M11 transistor shown in FIGS. 4 and 5, where the M3 transistor is a transistor responsible for output, a grid of the M3 transistor is connected with a pull-up node PU of the gate drive circuit 11, a first pole of the M3 transistor is connected with the clock signal line CLK, and a second pole of the M3 transistor is connected with Gout, that is, the signal is transmitted to the gate line GA of the display area A of the display substrate 10. If the schematic structural diagram shown in FIG. 5 is used, when the potential of the clock signal provided by the clock signal line CLK for the gate drive circuit 11 rises from the low level to the high level, the pull-up node PU of the gate drive circuit 11 turns on the grid of the M3 transistor. Optionally, when the transistor has a structure of an N-type transistor, a voltage difference between an input end and an output end of the clock signal line CLK is VGH-VGL, and reaches a theoretical maximum voltage difference. In this case, the root-mean-square current on the clock signal line CLK also reaches a great value, such that the temperature of the PLG during this process greatly rises. If the schematic structural diagram shown in FIG. 4 is used, an intermediate potential VGM is added during rising of the potential of the clock signal. In this way, a voltage difference of the clock signal may be set to VGH-VGM or VGM-VGL during pulling of the level of the clock signal, and the voltage difference is greatly reduced, such that the root-mean-square current of the clock signal line is obviously reduced, and the temperature of the PLG is obviously lowered. In addition, the shift register in the gate drive circuit 11 may include other device structures besides the M3 transistor and M11 transistor shown in FIG. 4, and may be set with reference to related technologies and will not be described in detail herein.

Figure 7:
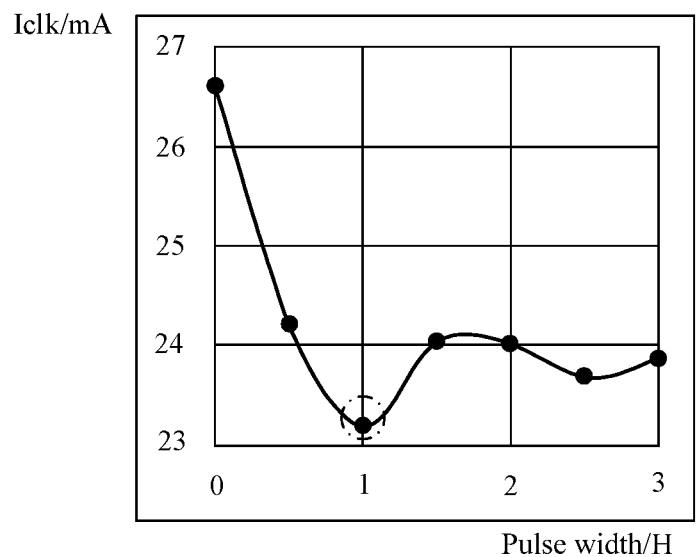
FIG. 7 is a schematic analog diagram concerning a root-mean-square current and a pulse width of an intermediate potential of a clock signal line in a display apparatus according to an embodiment of the present disclosure.
Figure 8:
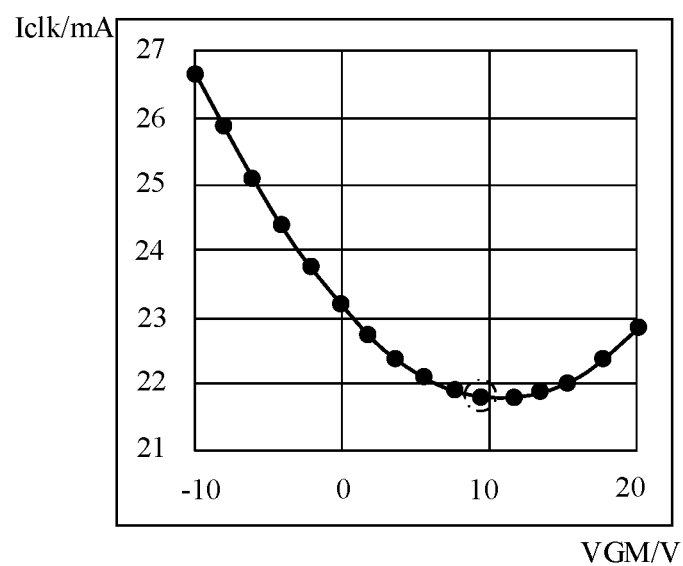
FIG. 8 is a schematic analog diagram concerning a root-mean-square current and a potential value of an intermediate potential of a clock signal line in a display apparatus according to an embodiment of the present disclosure.

One intermediate potential is still taken as an embodiment, with reference to FIGS. 7 and 8, FIG. 7 a schematic analog diagram concerning a root-mean-square current and a pulse width of an intermediate potential VGM of a clock signal line CLK, and FIG. 8 is a schematic analog diagram concerning a root-mean-square current and a potential value of an intermediate potential VGM of a clock signal line CLK, where Iclk represents the root-mean-square current of the clock signal line CLK, and the pulse width represents duration for keeping a corresponding potential value. During simulation of the root-mean-square current, the inventor has discovered that when the pulse width of the intermediate potential VGM is equal to scanning duration for scanning each row of pixels of the display substrate 10 by the gate drive circuit 11, the root-mean-square current of the clock signal line CLK is small, and correspondingly, the temperature of the clock signal line CLK is low, such that the temperature of the PLG is well lowered. When a numerical value of the intermediate potential VGM is equal to an average of total numerical values of the high level VGH and the low level VGL, and the temperature of the clock signal line CLK is low correspondingly, such that the temperature of the PLG is well lowered.

Figures 9, 10:
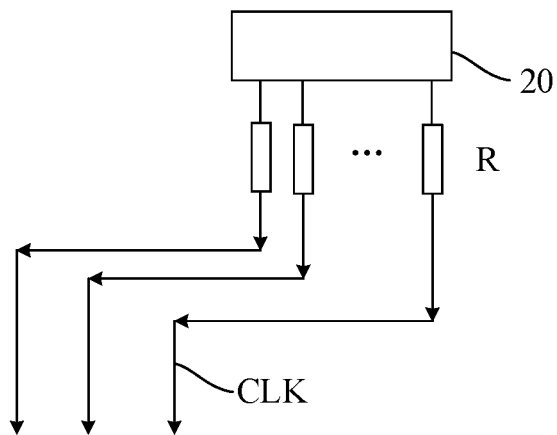
FIG. 9 is a schematic structural diagram of a display apparatus according to an embodiment of the present disclosure.
FIG. 10 is a method flowchart of a drive method for a display apparatus according to an embodiment of the present disclosure.

In an embodiment of the present disclosure, a resistor R is further arranged between each clock signal line CLK and the first circuit board 20, and the resistors R have equal resistances. FIG. 9 is a schematic structural diagram of a display apparatus. For example, when eight clock signal lines CLK are provided, one resistor is arranged between each clock signal line CLK and the first circuit board 20, total eight resistors are provided, and have equal resistances, thereby guaranteeing uniformity of the resistance of the clock signal lines CLK. In addition, under the condition of constant pressure difference, according to a calorific value formula $Q=I^2Rt$, after the resistor is added to each lock signal line CLK, the root-mean-square current of each clock signal line CLK is reduced, thereby lowering the temperature of the PLG and guaranteeing the usability of the display apparatus.

In an embodiment of the present disclosure, the resistor R is arranged on the first circuit board 20; or, the resistor R is arranged on the display substrate 10. That is, the added resistor may be arranged on the first circuit board 20, for example, a resistor with a required resistance may be welded on the first circuit board 20. The added resistor may also be arranged on the display substrate 10. In an actual application, the resistor may be added by corresponding process as required, which is not limited herein.

In some embodiments, the display apparatus may be any product or component with a display function, such as a mobile phone, a tablet computer, a television, a display, a notebook computer, a digital photo frame and a navigator. Other essential components of the display apparatus shall be understood as necessary by those of ordinary skill in the art, are not described herein in detail, and should not be regarded as limitation to the present disclosure.

Based on the concept of the present disclosure, as shown in FIG. 10, an embodiment of the disclosure further provides a method for driving a display apparatus. The method includes:

S101: providing, by the first circuit board, clock signals for a gate drive circuit by means of a plurality of clock signal lines; and S102: providing, by the second circuit board, data drive signals for a display substrate by means of a plurality of data lines of the display substrate.

In some embodiments, for a specific structure of a display apparatus using the drive method, reference may be made to the foregoing description, which will not be repeated herein. The first circuit board 20 may provide the clock signal for the gate drive circuit 11 by means of the plurality of clock signal lines CLK, thereby guaranteeing driving capability of the gate drive circuit 11. The second circuit board 30 may provide the data drive signal for the display substrate 10 by means of the plurality of data lines of the display substrate 10, thereby charging pixels in the display substrate 10 and guaranteeing usability of the display apparatus.

In an embodiment of the present disclosure, in order to lower the temperature of the clock signal line CLK during operation, the method further includes: during a rising edge of the clock signal switching from a low level to a high level, the clock signal is controlled to switch from the low level to an intermediate potential, keep at the intermediate potential for preset duration, and switch from the intermediate potential to the high level.

In some embodiments, during the rising edge of the clock signal switching from the low level to the high level, the clock signal may be controlled to switch from the low level to the intermediate potential, keep at the intermediate potential for preset duration, and switch from the intermediate potential to the high level.

In some embodiments, the preset duration is equal to scanning duration for scanning each row of pixels of the display substrate by the gate drive circuit.

In some embodiments, a value of the intermediate potential is equal to an average of total values of the low level and the high level.

Although the preferred embodiments of the present disclosure have been described, a person of ordinary skill in the art can make additional changes and modifications to these embodiments once they learn the basic inventive concept. Therefore, the appended claims are intended to be constructed as including the preferred embodiments and all changes and modifications falling within the scope of the present disclosure.

Apparently, those skilled in the art can make various modifications and variations to the present application without departing from the spirit and scope of the present application. In this way, if these modifications and variations of the present application fall within the scope of the claims of the present application and their equivalent technologies, the present application is also intended to include these modifications and variations.

The invention claimed is:

1. A display apparatus, comprising:
a display substrate, comprising a display area and a non-display area;
wherein the display substrate comprises:
gate drive circuit, connected with gate lines disposed in the display area;
a plurality of clock signal lines; and
a bonding pad;
a first circuit board; and
a second circuit board; wherein:
the first circuit board and the second circuit board are independent of each other;
the first circuit board is disposed at a side, facing away from the display area, of the second circuit board;
the first circuit board and the second circuit board are electrically connected with the bonding pad;
the first circuit board is electrically connected with the gate drive circuit by means of the plurality of clock signal lines; and
in an extension direction of the gate line, a width of the first circuit board is smaller than a width of the second circuit board.

2. The display apparatus according to claim 1, wherein the display apparatus comprises two gate drive circuits, the two gate drive circuits are respectively arranged on two different areas of the non-display area, and the two different areas correspond to the two opposite sides of the display area; and
the display apparatus comprises two first circuit boards, and the two first circuit boards are respectively connected with the two gate drive circuits in the non-display area.

3. The display apparatus according to claim 2, wherein the first circuit board and the second circuit board are flexible printed circuits;
the display apparatus further comprises: a printed circuit board;
an end of the first circuit board is electrically connected with the bonding pad; and
the other end of the first circuit board is electrically connected with the printed circuit board.

4. The display apparatus according to claim 3, wherein in the first circuit board and the second circuit board, merely the second circuit board comprises a data drive chip.

5. The display apparatus according to claim 4, wherein the display substrate comprises a plurality of data lines, and the data drive chip is electrically connected with the plurality of data lines.

6. The display apparatus according to claim 5, wherein a width of the first circuit board ranges from 3.0 mm to 4.0 mm in the extension direction of the gate line.

7. The display apparatus according to claim 6, wherein the clock signal lines have equal lengths in a transmission direction of a clock signal on the clock signal lines.

8. The display apparatus according to claim 7, wherein the clock signal lines have equal widths, ranging from 120 μm to 150 μm, in the extension direction of the gate line.

9. The display apparatus according to claim 8, wherein a distance between two adjacent clock signal lines ranges from 15 μm to 20 μm.

10. The display apparatus according to claim 9, wherein each of the clock signal lines comprises a first portion, a second portion and a third portion connected in sequence, wherein
the first portion is electrically connected with the gate drive circuit;
the third portion is electrically connected with the bonding pad;
an extension direction of the first portion and an extension direction of the third portion are same as an extension direction of the bonding pad;
the first portion is separated from the third part by a preset distance in a direction facing away from the bonding pad, and
an extension direction of the second portion intersects with the extension direction of the bonding pad.

11. The display apparatus according to claim 1, wherein each of the clock signal lines is configured to provide a clock signal for the gate drive circuit;
a rising edge of the clock signal from a low level to a high level is stepped; and
the rising edge comprises at least an intermediate potential arranged between the low level and the high level.

12. The display apparatus according to claim 1, wherein a resistor is arranged between each of the clock signal lines and the first circuit board.

13. The display apparatus according to claim 12, wherein the resistor is arranged on the first circuit board; or
the resistor is arranged on the display substrate.

14. A method for driving the display apparatus according to claim 1, comprising:
providing, by the first circuit board, clock signals for a gate drive circuit by means of a plurality of clock signal lines; and
providing, by the second circuit board, data drive signals for a display substrate by means of a plurality of data lines of the display substrate.

15. The method according to claim 14, further comprising:
controlling, during a rising edge of the clock signals switching from a low level to a high level, the clock signals to switch from the low level to an intermediate potential, keep at the intermediate potential for preset duration, and switch from the intermediate potential to the high level.

16. The method according to claim 15, wherein the preset duration is equal to scanning duration for scanning each row of pixels of the display substrate by the gate drive circuit.

17. The method according to claim 15, wherein a value of the intermediate potential is equal to an average of total values of the low level and the high level.

18. The display apparatus according to claim 2, wherein each of the clock signal lines is configured to provide a clock signal for the gate drive circuit;
a rising edge of the clock signal from a low level to a high level is stepped; and
the rising edge comprises at least an intermediate potential arranged between the low level and the high level.

19. The display apparatus according to claim 2, wherein a resistor is arranged between each of the clock signal lines and the first circuit board.

20. The display apparatus according to claim 19, wherein the resistor is arranged on the first circuit board; or the resistor is arranged on the display substrate.

* * * * *